(12) United States Patent
Hyun et al.

(10) Patent No.: US 6,449,585 B1
(45) Date of Patent: Sep. 10, 2002

(54) WAFER SIDEWALL INSPECTION SYSTEM AND METHOD

(75) Inventors: Ki-chul Hyun; Gyeong-su Keum, both of Kyungki-do (KR)

(73) Assignee: Samsung Electronics Co., Ltd., Kyungki-Do (KR)

( * ) Notice: Subject to any disclaimer, the term of this patent is extended or adjusted under 35 U.S.C. 154(b) by 0 days.

(21) Appl. No.: 09/320,140

(22) Filed: May 26, 1999

(30) Foreign Application Priority Data

Jun. 1, 1998 (KR) .......................................... 98-20287

(51) Int. Cl.[7] ................................................ G06F 11/30
(52) U.S. Cl. .............................. 702/183; 702/35; 382/8; 382/148
(58) Field of Search .............................. 702/82, 35, 36, 702/182, 183; 382/148, 140, 141, 149, 151, 152, 153, 8; 250/548

(56) References Cited

U.S. PATENT DOCUMENTS

| | | | |
|---|---|---|---|
| 4,604,910 A | * 8/1986 | Chadwick et al. ............. 74/96 |
| 4,618,938 A | * 10/1986 | Sandland et al. ........... 382/148 |
| 4,644,172 A | * 2/1987 | Sandland et al. ........... 250/548 |
| 4,647,764 A | * 3/1987 | Chadwick et al. .......... 250/216 |
| 5,880,479 A | * 3/1999 | Wang .......................... 250/548 |

* cited by examiner

*Primary Examiner*—Marc S. Hoff
*Assistant Examiner*—Mohamed Charioui
(74) *Attorney, Agent, or Firm*—Volentiine Francos, PLLC

(57) ABSTRACT

An inspection system and method for inspecting a sidewall of a wafer to detect a wafer having a sidewall defect. The inspection system includes, a wafer revolver driven by a driving source for rotating the wafer, an image capturing unit for capturing image information of the sidewall of the wafer rotating by the wafer revolver, and an analyzer comparing captured image data to image data of a desired wafer sidewall and determining whether the inspected wafer is acceptable in accordance with the comparison. The image capturing unit may include an illuminator for illuminating the sidewall of the wafer rotated by the wafer revolver and a detector for capturing image data for the sidewall of the wafer illuminated by the illuminator.

36 Claims, 5 Drawing Sheets

_US 6,449,585 B1_

WAFER SIDEWALL INSPECTION SYSTEM AND METHOD

CROSS-REFERENCES TO RELATED APPLICATIONS

The present application claims priority under 35 U.S.C. §119 to Korean Patent Application No. 98-20287 filed on Jun. 1, 1998, the entire contents of which are hereby incorporated by reference for all purposes.

BACKGROUND OF THE INVENTION

The present invention relates to an inspection system for inspecting wafers, and more specifically, to an inspection system for inspecting a wafer sidewall to detect a wafer having a sidewall defect, i.e., a deviation from a desired wafer sidewall. Furthermore, this invention to relates to an inspection method for inspecting a wafer side wall to detect a sidewall defect.

Conventional semiconductor device fabrication may include the deposition and/or formation of various layers such as polycrystalline silicon, silicon dioxide, silicon nitride, and metal layers, etc., over the surface of a silicon substrate. Various processes used include ion implantation, oxidation, photolithography, etching, metallization, and chemical mechanical polishing. Various layers are patterned and formed repeatedly to dispose conductive interconnection patterns between monolithic electronic components such as transistors, capacitors and resistors, and insulating layers; for example, silicon dioxide and phosphosilicate glass.

In the formation of semiconductor devices and structures on the semiconductor wafers using the various processes listed above, the semiconductor wafers pass through various semiconductor device fabrication facilities and processing machinery. According to the characteristics of each process, conditions such as processing temperature and pressure inside the corresponding facility or machine vary. In addition, the silicon wafers are passed through various mounting techniques and apparatuses used to fix the die, e.g., a chuck.

As a result, a sidewall of the wafer is often damaged by heat, pressure, and physical contact during the various processes. Once an initial defect or damage region is created, additional processing steps may propagate the defect or induce damage to the wafer. Stress on the wafer may concentrate pressure on a damaged portion and breakage may occur which will cause contamination of other wafers and components of the fabrication facility or machinery itself.

Accordingly, there is a need for a method and apparatus for inspecting the wafer side wall to detect and ensure that the wafer is acceptable for successful semiconductor processing. Typically, acceptability means that no defect or damage exists to the wafer sidewall.

Common techniques for semiconductor wafer sidewall inspection include manually selecting a number of wafers from a batch of wafers and visually inspecting each wafer side wall to detect any anomalies on the sidewall surface. However, often a visual inspection of the wafer sidewall does not provide adequate detection accuracy. Moreover, the manual inspection process is time consuming, and requires involved operator intervention.

Accordingly, there is a need for a method of quickly inspecting a semiconductor wafer sidewall to detect any defects or damage so that the wafer may be successfully used in the subsequent fabrication of a semiconductor product. There is a need for a method of quickly inspecting the wafer sidewall to detect and remove unacceptable wafers, thereby increasing semiconductor device yields.

In addition, cross contamination of semiconductor wafers by stray particles broken from other wafers needs to be minimized by increasing wafer quality to maintain the reliability of expensive semiconductor fabrication machinery.

Finally, there is a need for minimizing operator dependency in ensuring semiconductor product reliability to maximize semiconductor productivity in semiconductor devices by reducing the semiconductor production on defective wafers.

SUMMARY OF THE INVENTION

The present invention is therefore directed to a method and system for inspecting wafer sidewalls which substantially overcomes one or more of the problems due to the limitations and disadvantages of the related art.

According to an object of the present invention, a method and apparatus automatically inspects a wafer sidewall to determine acceptability of the wafer for use in the subsequent fabrication of a semiconductor product.

Another object of the present invention is to provide a method and system for quickly inspecting the wafer sidewall to detect and remove unacceptable wafers, thereby increasing semiconductor device yields.

Yet another object of the present invention is to minimize cross-contamination of semiconductor wafers by broken wafer particles by reducing wafer breakage to maintain the reliability of expensive semiconductor fabrication machinery.

A further object of the present invention is to minimize subjective operator error in ensuring semiconductor product reliability to further productivity in semiconductor devices by minimizing the processing of defective wafers.

At least one of the above and other objects may be realized by providing an apparatus including an image information acquisition unit, such as a CCD (Charge Coupled Device) camera, having an image sensor which captures image data of the wafer sidewall and an analyzer which compares the measured image data to data from a desired sidewall to determine if the wafer sidewall is acceptable.

The analyzer may be a computer and may include an output unit for providing paper output and/or visual output may be connected to the analyzer for indicating the results of the comparison to a user. If more than one wafer sidewall portion is to be inspected, the requisite data is preferably acquired by one of the two following specific embodiments.

In a first specific embodiment, the inspection system may include a vertical member fixed to a base and a wafer revolver, situated on the base, to rotate the wafer. The wafer sidewall surface is exposed and rotated in front of the image acquisition unit. A horizontal member is attached to the vertical member at one end, and has the image acquisition unit attached to the other end such that the image acquisition unit is positioned over the exposed sidewall surface of the wafer. A stage is disposed on a base which secures the wafer revolver and allows the wafer revolver to move horizontally along a center axis of the wafer to align additional wafers which may be placed in the holder.

In a second specific embodiment, the image acquisition unit may include an illuminator and a detector attached to a moveable attachment head mounted to an end of a horizontal support. The end of the horizontal support in this embodiment has a toothed rack which meshes with a pinion gear inside the moveable attachment head to allow controlled movement of the image acquisition unit along the horizontal support.

At least one of the above and other objects of the present invention may be realized by providing a method for inspecting a wafer including capturing image data of a sidewall region of the wafer and comparing captured data to data for a desired sidewall to determine whether the wafer being inspected is acceptable.

The method may include providing paper output and/or visual output for indicating the results of the comparison to a user. If more than one wafer sidewall portion is to be inspected, the requisite data is preferably acquired by one of the two following specific embodiments.

A method according to the first specific embodiment of the present invention further includes counting the number of wafers as the stage is moved horizontally along the center axis of the wafer to scan the number of wafers present in the cassette. The image data of a first wafer having a first sidewall is captured during a complete rotation of sidewall surface area. After a complete rotation of sidewall surface area, the stage is moved and image data of a second wafer is captured through the complete rotation of the second wafer. This process is repeated until all wafers in a cassette are processed.

A method according to the second specific embodiment of the present invention further includes counting the wafers by moving a moveable attachment head to scan the number of wafers present in the cassette. A detector is moved across the exposed sidewall surface of all the wafers in a cassette to capture a portion of the sidewall image information from all the wafer sidewalls simultaneously. The wafers are then rotated by a first amount and the process repeated until a composite of all the sidewall surface area of all the wafers in the cassette is captured.

These and other objects of the present invention will become more readily apparent from the detailed description given hereinafter. However, it should be understood that the detailed description and specific examples, while indicating the preferred embodiments of the invention, are given by way of illustration only, since various changes and modifications within the spirit and scope of the invention will become apparent to those skilled in the art from this detailed description.

BRIEF DESCRIPTION OF THE DRAWINGS

In the course of the detailed description to follow, reference will be made to the attached drawings in which.

DETAILED DESCRIPTION OF THE PREFERRED EMBODIMENTS

Figure 1:
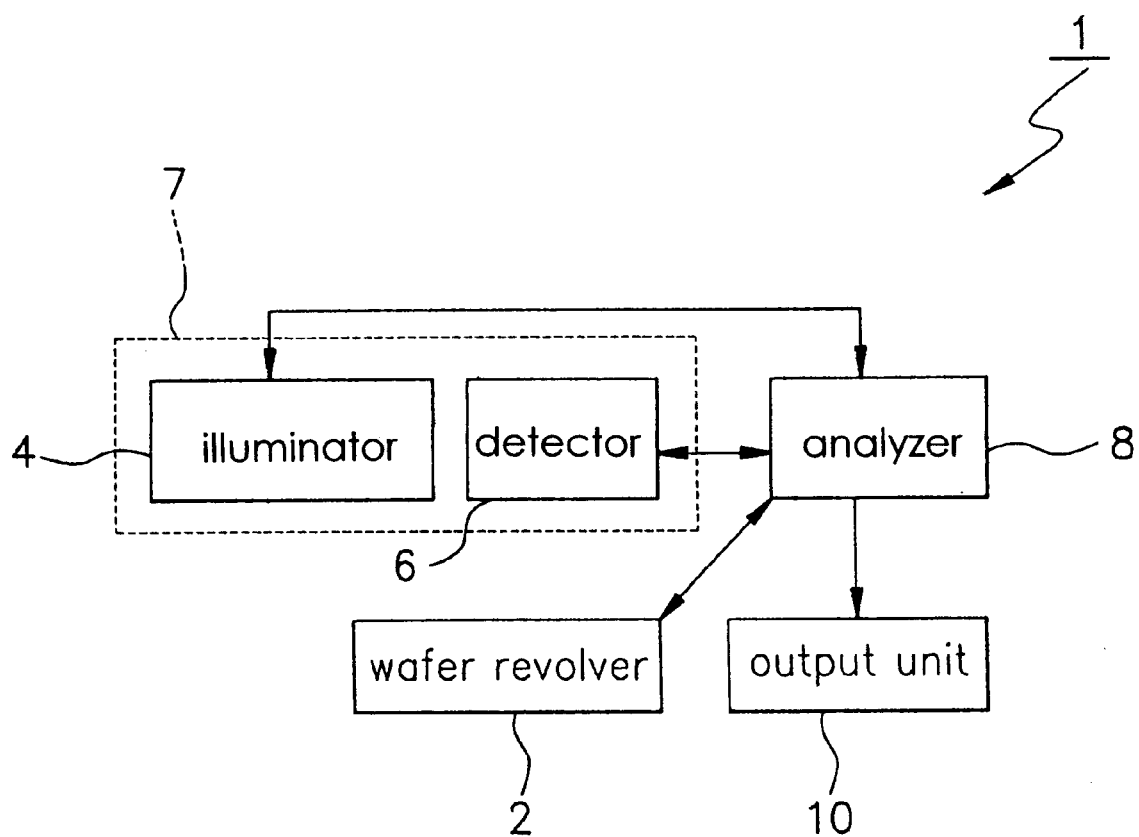
FIG. 1 is a schematic block diagram representation of an inspection system for wafers according to the present invention.

The present invention is directed to a method and apparatus for inspecting the sidewall of a wafer to detect any defects or damage in the wafer sidewall so that the wafer may be successfully used in the fabrication of a semiconductor product. According to the present invention, the wafer having the sidewall defect can be economically and efficiently detected and removed before any further semiconductor processing is executed. The removal of defective wafers will improve the semiconductor yield and extend the effective life of expensive semiconductor machinery by decreasing the amount of wafer breakage and wafer particle contamination. The method of the present invention minimizes any operator intervention in the inspection process to increase productivity and reliability. The present invention will be described in detail through preferred embodiments with reference to accompanying drawings. Throughout the drawings, the same reference numerals denote the same elements.

Referring to FIG. 1, an inspection system 1 for wafers includes a wafer revolver 2 for rotating wafers placed in a wafer holder,e.g., a cassette, and positioning a surface of a sidewall of a perimeter of the wafer to face an image acquisition unit 7 for capturing image information of a portion of the sidewall. In this example, the image acquisition unit 7 includes an illuminator 4 which illuminates the portion of the sidewall in front of the image acquisition unit 7 and a detector 6 which captures image data of the portion of the sidewall illuminated by the illuminator.

The illuminator for is preferably a semiconductor laser, but may be any source, e.g., infrared or ultra violet, selected according to the type of image acquisition sensor to be employed. The detector 6 is preferably a CCD (Charge Coupled Device) camera having an automatic focusing zoom lens. Other types of image acquisition sensors may be substituted for the camera. For example, a CMOS active pixel array, an infrared CCD or ultra violet light camera may be used to generate the image information, with a corresponding change in the type of illuminator.

An analyzer 8 receives the image information captured by the detector 6 and compares the captured image data to image data from a desired sidewall. Typically, the desired sidewall is free of defects. When the captured image data sufficiently corresponds to the desired image data, the wafer is determined to be acceptable. The allowed difference between the measured image data and the desired or ideal image data is dependent upon the defect tolerance for particular applications/subsequent processing.

In a preferred embodiment, the analyzer 8 is implemented as a computer which compares the captured image data to desired image data is performed using known image processing techniques. An output unit 10 outputs the results of the comparison. This output may be in any fashion which will alert a user to the acceptability of the wafer, e.g., printed or displayed. The computer preferably also controls other components of the system 1, such as the wafer revolver 2 and the illuminator 4.

While the wafer revolver 2 serves to rotate the wafer for inspection of an entire sidewall surface thereof, when inspecting the sidewall of more than one wafer, the wafers and the image acquisition unit need to be translated relative to one another. Two preferred embodiments for achieving such relative translation are provided below.

Figure 2:
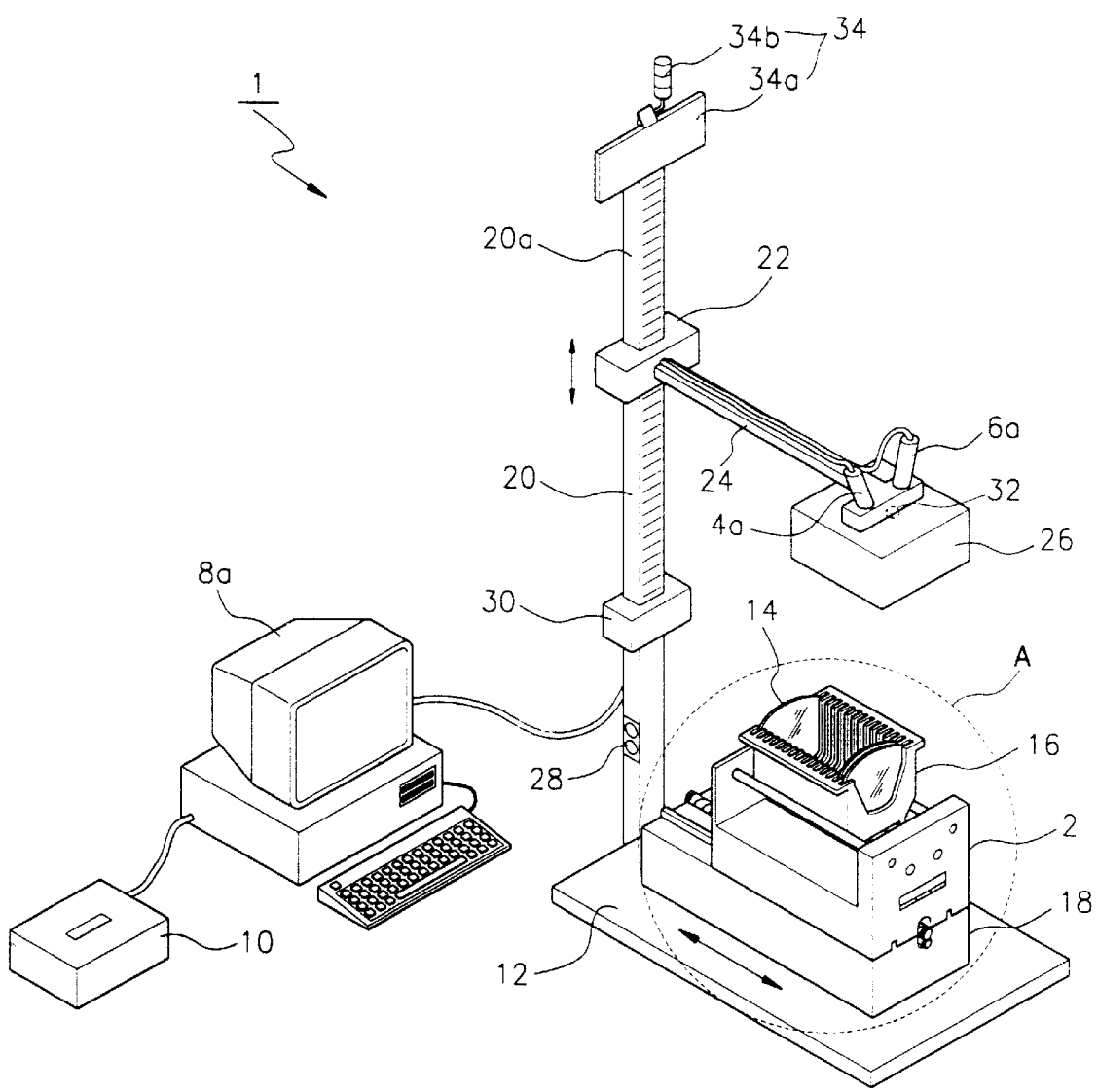
FIG. 2 is a schematic diagram of an inspection system for wafers according to a first embodiment of the present invention.

FIG. 2 illustrates the inspection system 1 according to a first embodiment of the present invention. The wafer revolver 2 rotates wafers 14 placed inside a cassette 16. The wafer revolver 2 is disposed on a base 12. The wafer revolver 2 orients a sidewall surface of the wafer perimeter for inspection. Other configurations of disposing the wafers 14 for inspection may be used. For example, the wafers may be stacked vertically to orient their respective sidewalls for inspection.

In this first embodiment, a stage 18 disposed on the base 12 secures the wafer revolver 2 and allows the wafer revolver 2 to move horizontally along a center axis of the wafer 14. A vertical support 20 is fixed to a side of the base 12. A horizontal support 24 is attached to the vertical support 20 by a moveable sleeve section 22 which allows vertical up and down movement of the horizontal support 24 using the vertical support 20 as a guide rail. A box-shaped shielding case 26 attached on the end of the horizontal support 24 partially houses the image acquisition unit to shield against any light or other medium which may distort the image data.

In this embodiment, an image acquisition unit includes, for example, a semiconductor laser 4a and CCD camera 6a attached to an end of the horizontal support 24 over the wafers 14. The laser 4a illuminates the exposed sidewall portion of the wafer 14 situated in front of the CCD camera sensor array (not seen) to capture the image information of the sidewall portion. The wafer revolver 2 revolves the wafers 14 to provide another portion of the sidewall surface for image information capture. The CCD camera 6a preferably has an automatic focusing zoom lens for acquiring a detailed and distortion free image of the sidewall of the wafer 14 by controlling the distance between the CCD camera 6a and the sidewall of the wafer 14.

In this first embodiment, a computer 8a receives the image information captured by the CCD camera 6a for comparison with image data of a desired sidewall to determine if the sidewall portion captured is acceptable. The computer 8a may output data to an output unit 10 or may display information on a screen. The computer system 8a may control other components of the inspection system 1, such as the up and down motion of the moveable sleeve section 22 and the intensity of the laser 4a.

In the first embodiment, the vertical support 20 may include a rack with teeth 20a that mesh with a pinion gear (not seen) inside the moveable sleeve section 22. The pinion gear inside the moveable sleeve section 22 may be driven by a motor (not seen) fed by an electrical signal connected to a switch 28 which may be attached to a side of the vertical support 20. The pinion gear inside the moveable sleeve section 22 may rotate and mesh with the rack with teeth 20a to provide vertical up and down movement to the horizontal support 24. By vertically raising and lowering moveable sleeve section 22 and horizontal support 24, the cassette 16 may be loaded onto or removed from the wafer revolver 2.

A stopper 30 is preferably provided on the vertical support 20 for limiting the vertical displacement of the horizontal support 24 to prohibit the shielding case 26 and image acquisition unit from contacting the cassette 16 and imposing any damage onto the wafers 14 which may result.

A wafer count sensor 32 is provided inside the shielding case 26 and may be displaced between the CCD camera 6a and the semiconductor laser 4a for sensing the number of wafers 14 placed in the cassette 16 by counting the wafers as the cassette 16 holding a plurality of wafers 14 and the base 12 is moved laterally.

A display 34 which include a display screen, for example, a liquid crystal display (LCD), 34a, may be attached to the upper side of the vertical support 20 for displaying the number of wafers inspected and a system status of the inspection system 1. The display 34 may also include a signal tower 34b for displaying the operation state of the system with lamps having different colors to allow checking of the system state from a distance by displaying a lamp color in the signal tower 34b which corresponds to a particular system state.

Figure 3:
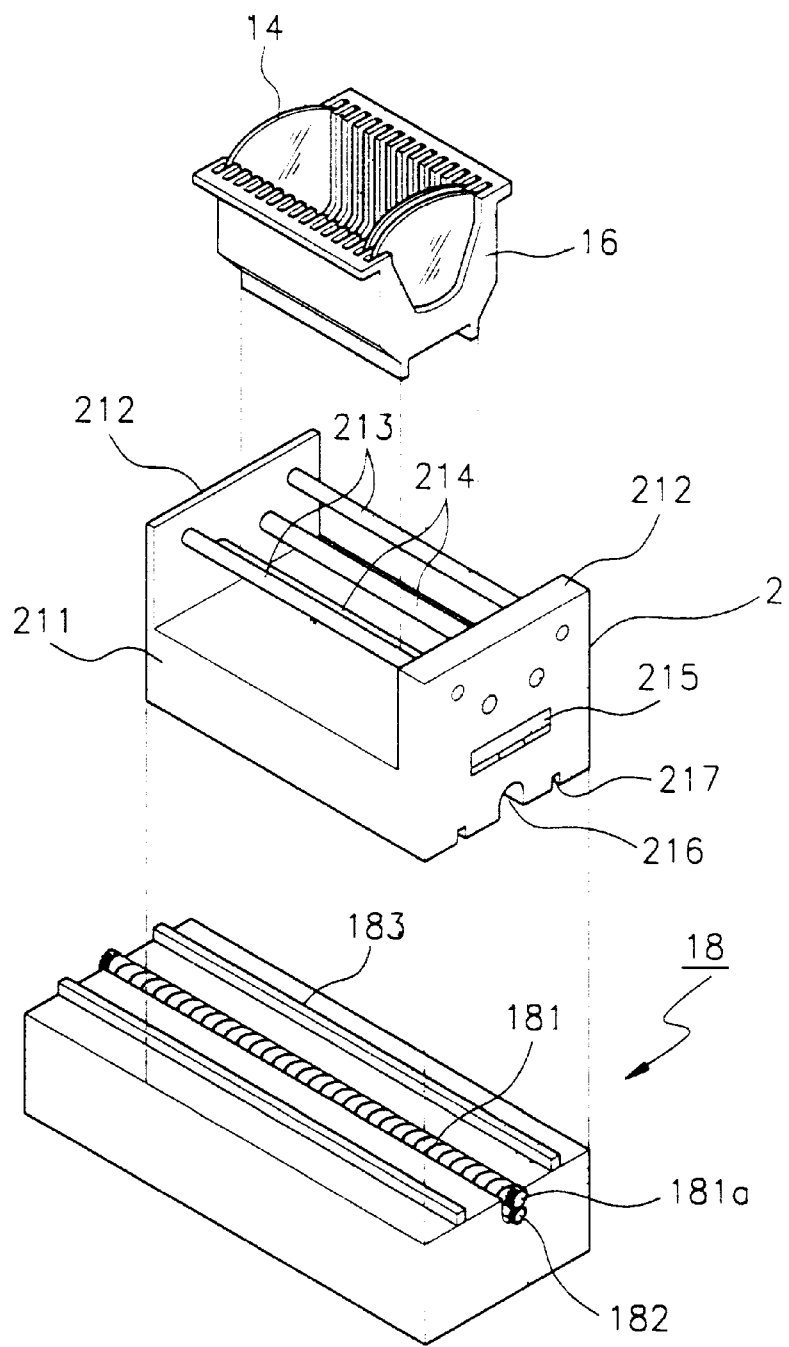
FIG. 3 is a detailed schematic diagram of the circled portion A in FIG. 2 of the inspection system for wafers according to the first embodiment.

FIG. 3 is a detailed schematic diagram of the circled portion A in FIG. 2, in particular of the wafer revolver 2 and the stage 18. As shown herein, the wafer revolver 2 includes a moveable cradle base 211 having a cradle member 212 attached to each end to oppose one another on the cradle base 211. The wafer revolver 2 further includes two support rods 213 which are fixed in parallel and traverse the span between the two cradle members 212 at the same height to support the cassette 16 mounted thereon.

In addition, the wafer revolver 2 includes a wafer rolling mechanism to rotate the wafers. In this embodiment, the wafer rolling mechanism includes two rolling rods 214, which are located under the support rods 213 and are parallel to the two support rods 213 at an equal height. The rolling rods 214 are rotated by a driving source such as a motor (not seen) which may be controlled by a controller 215. The wafers 14 are disposed in the cassette 16 which is disposed in between the two cradle members 212 and the two support rods 213 wherein the wafers may contact the rolling rods and rotate as the rolling rods rotate.

In addition to the above, as shown in FIG. 3, a horizontal drive mechanism is preferably included to mechanically move the wafers 14, placed in the cassette 16 situated in the cradle base 211, in a lateral direction. In this embodiment, the horizontal drive mechanism includes screw groove 216 provided at the bottom center of the cradle base 211 along the longitudinal direction of the wafer revolver 2. A guide groove 217 is formed equidistant on both sides of the screw groove 216 in the longitudinal direction of the wafer revolver 2 for guiding movement of the cradle base 211 in a horizontal direction with respect to the stage.

The horizontal drive mechanism also includes screw rod 181 disposed on the upper side of the stage 18 for moving the wafer revolver 2 along the longitudinal direction of a center axis of the wafer 14 by rotating the screw rod 181 to drive the screw groove 216. A motor (not seen) inside the stage 18 provides a rotation force to a gear 182 which meshes with and turns a gear 181a attached to the end of the screw rod 181. This lateral motion is used during the counting of the wafers by the wafer count sensor 32 shown in FIG. 2.

Figure 4:
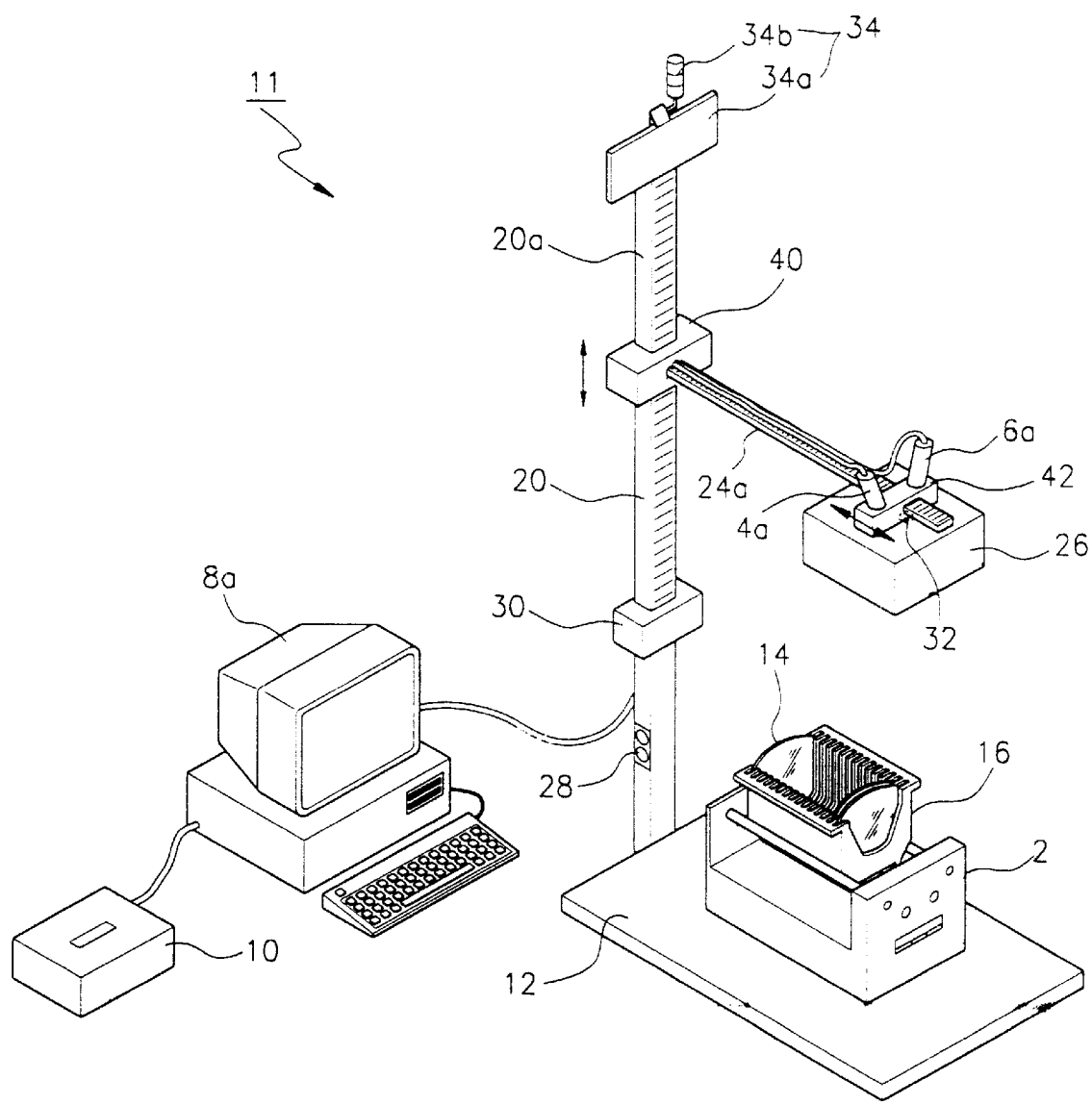
FIG. 4 is a schematic diagram of an inspection system for wafers according to a second embodiment of the present invention.

With reference to FIG. 4, an inspection system 11 according to a second embodiment of the present invention is illustrated. Like numbers refer to like elements as shown in the drawings of the first embodiment, and the description thereof is omitted. However, different numbers are used for some of the same elements due to the changes of relative relations due to the change in the configurations. In the second embodiment, while the wafers are still rotated it is the image acquisition unit which is translated. Thus, stage 18 is no longer required, while a moveable sleeve is provided to translate the image acquisition unit.

As shown in FIG. 4, the inspection system 11 includes a wafer revolver 2 which rotates wafers 14 and is disposed on a base 12. A vertical support 20 is fixed to a side of the base 12. A horizontal support 24a is attached to the vertical support 20 by a moveable sleeve section 40 which allows vertical up and down movement of the horizontal support 24 using the vertical support 20 as a guide rail.

In this second embodiment, the image acquisition unit includes, for example, a semiconductor laser 4a and a CCD camera 6a attached to a moveable attachment head mounted to an end of the horizontal support 24a over the wafers 14. The end of the horizontal support 24a in this embodiment has a toothed rack which meshes with a pinion gear (not seen) in a second moveable sleeve section 42 to allow controlled movement along the horizontal support 24. The laser 4a illuminates the exposed sidewall portion of the wafer 14 situated in front of the CCD camera sensor array (not seen) to capture the image information of the sidewall portion. The wafer revolver 2 rotates the wafer to provide another portion of the sidewall surface for image information capture. The CCD camera 6a preferably has an automatic focusing zoom lens for acquiring a detailed and distortion free image of the sidewall of the wafer 14 by controlling the distance between the CCD camera 6a and the sidewall of the wafer 14.

A computer system 8a receives the image information captured by the CCD camera 6a for comparison with image data of a desired sidewall. The computer system 8a may use an image information processing program to determine if the sidewall portion captured is acceptable. The computer system 8a may output data to an output unit 10 or may display information on a screen and may control other components of the inspection system 1 such as the up and down motion of the moveable sleeve section 40 and the intensity of the laser 4a.

A box-shaped shielding case 26 is disposed on the end of the horizontal support 24a for partially housing the image acquisition unit to shield against any light or other medium which may distort the image information. In the second embodiment, the shielding case 26 protects the CCD camera 6a and laser 4 and shields background light to allow very accurate image information capture.

The vertical support 20 may include a rack with teeth 20a that mesh with a gear (not seen) inside the moveable sleeve section 40. The gear inside the moveable sleeve section 40 may be driven by a motor (not seen) fed by an electrical signal connected to a switch 28 which may be attached to on a side of the vertical support 20. The gear inside the moveable sleeve section 40 may rotate and mesh with the rack with teeth 20a to provide vertical up and down movement to the horizontal support 24a.

A stopper 30 is provided on the vertical support 20 for limiting the vertical displacement of the horizontal support 24a to prohibit the shielding case 26 and image acquisition unit from contacting the cassette 16 and imposing any damage onto the wafers 14 which may result.

A wafer count sensor 32 is provided inside the shielding case 26 and is displaced between the CCD camera 6a and the semiconductor laser 4a. The wafer count sensor 32 counts the number of wafers 14 placed in the cassette 16. The moveable attachment head 42 may guide the image acquisition unit over the cassette 16 to count the number of wafers 14 placed therein.

A display 34 including a display screen, for example, a liquid crystal display (LCD), 34a may be attached to the upper side of the vertical support 20 for displaying the number of wafers inspected and a system status of the inspection system 11. The display 34 may also include a signal tower 34b for displaying the operation state of the system with lamps having different colors to allow checking of the system state from a distance by displaying a lamp color of the signal tower 34b which corresponds to a particular system state.

Thus, in either embodiment, the image acquisition unit and the wafers are moved relative to one another to measure the requisite image data.

The vertical support in the first embodiment and the second embodiment includes at least one member and various modifications can be made. For example, two members may be used to structurally support the horizontal support. In addition various changes can be made to the horizontal support to structurally support the image acquisition unit. For example two or more members may be used.

Other methods and apparatuses may be employed in either embodiment to rotate the wafers. For example, a wafer flat zone aligner can be used to rotate the wafers in a complete three hundred and sixty-degree rotation without stopping and also to align the wafers before subsequent processing.

Figure 5:
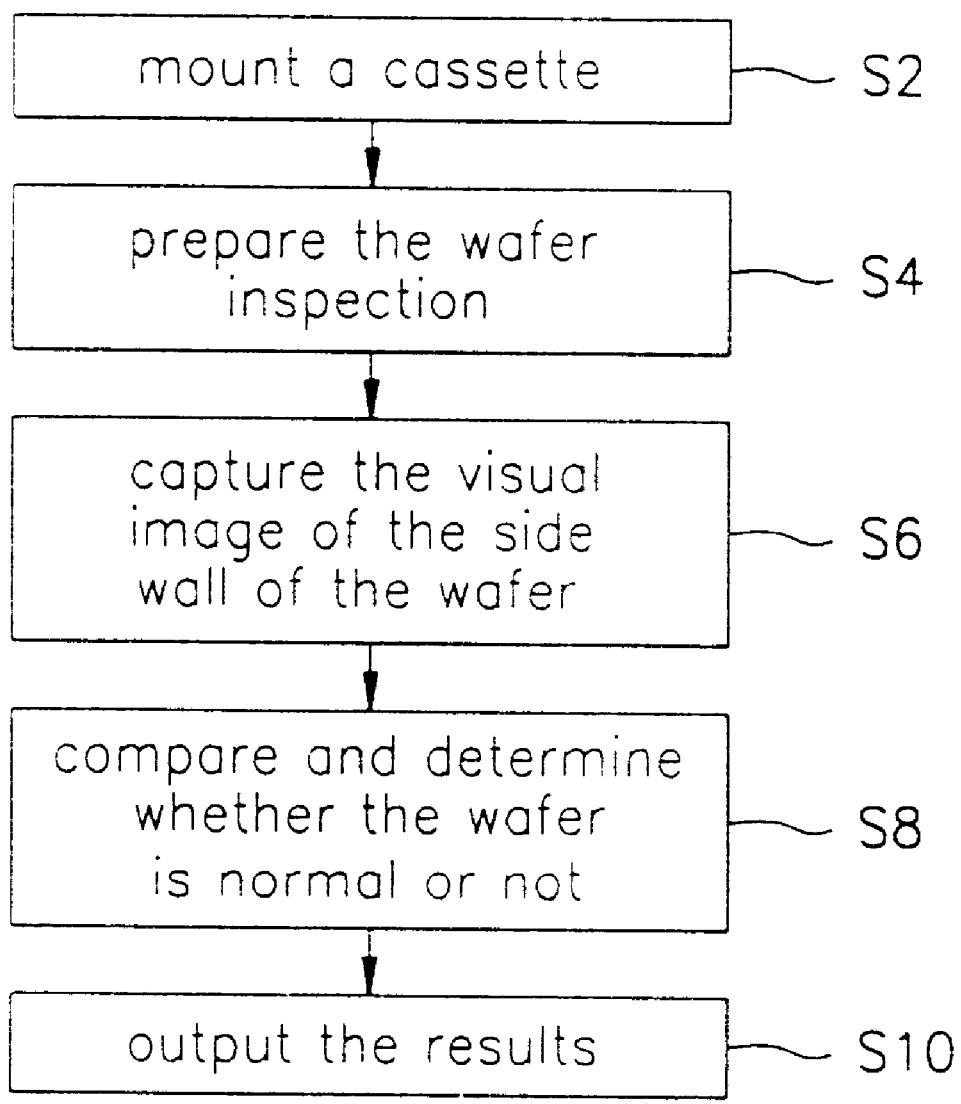
FIG. 5 is a block diagram representation illustrating a process sequence of a method for inspecting wafers according to the present invention.

With reference to FIG. 5, a method of inspecting wafers and more specifically a method of inspecting a wafer sidewall of a wafer is illustrated as a flow diagram.

In a step S2, a cassette 16 having wafers 14 to be inspected is mounted onto the wafer revolver 2. Such mounting may include raising the horizontal support 24, 24a using the switch 28 which controls the height of the horizontal support 24, 24a, placing the cassette 16 containing the wafers 14 onto the wafer revolver 2, and lowering the horizontal support 24, 24a down to the stopper 30.

In a step S4, wafer inspection is prepared. Such preparing may include scanning the wafers 14 to count the number of wafers in the cassette 16 to be inspected by sensing occupied wafer slots to correctly position the image sensor over the wafer sidewalls, and arranging the image acquisition unit by aligning the illuminator 4 and the detector 6 with the wafer sidewall to be inspected.

In a method according to the first embodiment of the present invention, counting the wafers is performed using the wafer count sensor 32 mounted in the image information acquisition unit while moving the stage 18 horizontally along the center axis of the wafer to scan the number of wafers present in the cassette 16.

In a method according to the second embodiment of the present invention, counting the wafers is performed as the image information acquisition unit containing the wafer count sensor 32 is moved horizontally along the center axis of the wafer 14 by moving the moveable attachment head 42 to scan the number of wafers present in the cassette 16.

In a step S6, the image acquisition unit captures image data of the sidewall of the wafers for a complete rotation of the wafers to capture the complete sidewall surface area.

In a method according to a first embodiment, such capturing includes aligning the image acquisition unit with a first wafer having a first sidewall and capturing a complete rotation of sidewall surface area. After a complete rotation of sidewall surface area is captured, the image acquisition unit is aligned with a second wafer by moving the stage 18. This process is repeated until all wafers 14 in cassette 16 are captured.

In a method according to a second embodiment, such capturing includes moving the image acquisition unit across the exposed sidewall surface of all the wafers 14 in a cassette 16 to capture a portion of the sidewall image information from all the wafer sidewalls. The wafers are then rotated by a first amount. The process is repeated until a composite of all the sidewall surface area of all the wafers 14 in the cassette 16 is captured.

In a step S8, the captured image data of the wafer sidewall is compared with image data of a desired, typically defect-free, wafer sidewall. In a preferred embodiment a computer 8a having an image information processing program is used to perform the comparison by comparing a light intensity measured from the wafer sidewall. If the sidewall inspected substantially matches the desired sidewall, then the light intensity reflected will measure within a known threshold level. If the sidewall inspected does not match a desired sidewall, e.g., contains a defect, then the light reflected would measure outside a threshold level, i.e., would reflect more or less light than the desired wafer sidewall. This threshold level depends on the defect level acceptable for a particular application or subsequent processing. As a step S10, the results from the comparison and determination are output, for example using a paper printout or a monitor display.

Therefore, according to the present invention, an unacceptable wafer can be economically and efficiently detected and removed before any further semiconductor processing is executed. The removal of unacceptable wafers will improve the semiconductor yield and extend the effective life of expensive semiconductor machinery by decreasing the amount of wafer breakage and wafer particle contamination.

Various embodiments of an inspection system for inspecting wafers and various methods of inspecting a wafer have been described. It is understood, however, that changes and modifications may be made without departing from the true scope and spirit of the present invention as defined by the following claims.

What is claimed is:

1. An inspection system for inspecting a sidewall of a wafer, wherein the wafer sidewall is located at a perimeter of the wafer, the inspection system comprising:
   an image information acquisition unit having an image sensor which faces the wafer sidewall and captures image data of a wafer sidewall portion; and
   an analyzer which compares the image data captured by the image information acquisition unit to data of a desired wafer sidewall portion to determine if the wafer is acceptable.

2. The inspection system of claim 1, further comprising:
   a base;
   at least one vertical member fixed to the base;
   a wafer revolver disposed on the base, to rotate the wafer having an exposed sidewall portion; and
   a horizontal member coupled to the at least one vertical member at a first end portion, wherein the horizontal member is positioned over the base at a first height of the vertical member;
   wherein the image acquisition unit is attached to the horizontal member at a second end and the image sensor is positioned facing the exposed sidewall portion for capturing image information of the wafer sidewall as the wafer rotates.

3. The inspection system of claim 2, wherein the wafer revolver includes a cradle and a stage, the cradle being disposed on top of the stage and moves in a first direction with respect to the stage to position the exposed sidewall portion proximal to the image sensor.

4. The inspection system of claim 3, wherein the cradle is driven by a horizontal drive mechanism.

5. The inspection system of claim 4, wherein the horizontal drive mechanism includes a screw rod and a guide.

6. The inspection system of claim 2, further comprising a moveable sleeve section attached to the first end portion which moves the horizontal member vertically along the vertical member.

7. The inspection system of claim 6, further comprising a vertical drive mechanism driving the moveable sleeve section vertically along the vertical member.

8. The inspection system of claim 7, wherein the vertical drive mechanism includes a rack and pinion type gear mechanism.

9. The inspection system of claim 2, wherein the wafer revolver includes a wafer rolling mechanism to rotate the wafers.

10. The inspection system of claim 9, wherein the wafer rolling mechanism includes rolling rods driven by a motor.

11. The inspection system of claim 2, wherein the image acquisition unit is mounted on a moveable attachment head.

12. The inspection system of claim 11, further comprising a pinion gear meshing with a toothed rack which drives the moveable attachment head.

13. The inspection system of claim 2, further comprising a display for indicating an operation state of the system.

14. The inspection system of claim 13, wherein the display includes at least one of a liquid crystal display and a color lamp.

15. The inspection system of claim 2, wherein the image acquisition unit includes a shielding case.

16. The inspection system of claim 2, further comprising a stopper disposed on the vertical member for limiting lower placement of the horizontal member.

17. The inspection system of claim 2, further comprising a wafer count sensor for counting a number of wafers.

18. The inspection system of claim 1, further comprising a cassette holding a plurality of wafers.

19. The inspection system of claim 18, further comprising a translation unit which moves the plurality of wafers and the image acquisition unit relative to each other.

20. The inspection system of claim 1, wherein the image information acquisition unit further includes an illuminator which illuminates the sidewall of the wafer.

21. The inspection system of claim 20, wherein the illuminator is a semiconductor laser.

22. The inspection system of claim 1, wherein the image sensor is a charge coupled device type camera and the image data includes visual image data.

23. The inspection system of claim 1, wherein the analyzer is a computer system having an image processing program.

24. The inspection system of claim 1, further comprising a wafer revolver which rotates the wafer.

25. A method of inspecting a wafer sidewall of a wafer comprising:
   capturing image data of a region of the wafer sidewall from a position facing the wafer sidewall;
   comparing captured image data to data from a desired sidewall; and
   determining from the comparing whether the wafer is acceptable.

26. The method of claim 25, wherein a plurality of wafer sidewalls are inspected, the wafer sidewall region is a first wafer sidewall region, and the image data is first image data, further comprising:
   capturing second image data of a second wafer sidewall region;
   comparing captured second image data to data from a desired sidewall; and
   determining the acceptability of the first wafer sidewall region and the second wafer sidewall region from the comparing.

27. The method of claim 26, further comprising:
capturing third image data of a third wafer sidewall region; and
capturing fourth image data of a fourth wafer sidewall region.

28. The method of claim 27, wherein the third and fourth wafer sidewall regions are included on a second wafer.

29. The method of claim 28, further comprising positioning an image acquisition sensor proximal to the second wafer before capturing the third and fourth wafer sidewall regions.

30. The method of claim 26, wherein the first wafer sidewall region and the second wafer sidewall region are included on a first wafer of the plurality of wafers.

31. The method of claim 30, further comprising rotating the first wafer after the first wafer sidewall region is exposed to expose the second wafer sidewall region.

32. The method of claim 26, wherein the first wafer sidewall region is on a first wafer and the second wafer sidewall region is on a second wafer.

33. The method of claim 32, wherein the second wafer sidewall region is exposed to an image acquisition sensor by positioning the image acquisition sensor proximal to the second wafer sidewall region.

34. The method of claim 26, further comprising rotating the first wafer after capturing the first wafer sidewall region to capture the second wafer sidewall region.

35. The method of claim 26, further comprising counting the wafers to derive a wafer count information.

36. The method of claim 25, further comprising illuminating the region of the wafer sidewall, wherein the image data is a light intensity representation.

\* \* \* \* \*